United States Patent
Yang et al.

(10) Patent No.: US 12,266,722 B2
(45) Date of Patent: Apr. 1, 2025

(54) HEMT WITH PLATE OVER CHANNEL LAYER

(71) Applicant: UNITED MICROELECTRONICS CORP., Hsin-Chu (TW)

(72) Inventors: Po-Yu Yang, Hsinchu (TW); Hsun-Wen Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 952 days.

(21) Appl. No.: 17/207,719

(22) Filed: Mar. 21, 2021

(65) Prior Publication Data

US 2022/0246750 A1    Aug. 4, 2022

(30) Foreign Application Priority Data

Feb. 4, 2021  (CN) .......................... 202110156459.0

(51) Int. Cl.
*H01L 29/778* (2006.01)
*H01L 29/66* (2006.01)

(52) U.S. Cl.
CPC .... *H01L 29/7786* (2013.01); *H01L 29/66431* (2013.01)

(58) Field of Classification Search
CPC .......................... H01L 29/7786; H01L 29/778
See application file for complete search history.

(56) References Cited

U.S. PATENT DOCUMENTS

| | | | |
|---|---|---|---|
| 8,680,535 B2 | 3/2014 | Yao et al. | |
| 2013/0082336 A1* | 4/2013 | Imada | H01L 29/0619 257/E21.409 |
| 2014/0097471 A1* | 4/2014 | Briere | H01L 29/402 257/194 |
| 2014/0159116 A1* | 6/2014 | Briere | H01L 29/7786 257/194 |
| 2015/0144957 A1* | 5/2015 | Lu | H01L 29/0607 257/76 |
| 2015/0155358 A1* | 6/2015 | Briere | H01L 29/405 257/194 |
| 2017/0033187 A1* | 2/2017 | Rajan | H01L 29/8611 |
| 2017/0345918 A1* | 11/2017 | Iucolano | H01L 29/402 |

\* cited by examiner

*Primary Examiner* — Peter Bradford
(74) *Attorney, Agent, or Firm* — Winston Hsu (57) ABSTRACT

The present disclosure relates to a semiconductor device and its manufacturing method, and the semiconductor device includes a substrate, a channel layer, a gate electrode, a first electrode, a second electrode, and a metal plate. The channel layer is disposed on the substrate, and the gate electrode is disposed on the channel layer. The first electrode and the second electrode are disposed on the channel layer, at two opposite sides of the gate electrode respectively. The metal plate is disposed over the channel layer, between the first electrode and the gate electrode. The metal plate includes a first extending portion and a second extending portion, wherein the second extending portion extends towards the substrate without contacting the channel layer, and the first extending portion extends toward and directly contacts the first electrode or the second electrode.

20 Claims, 8 Drawing Sheets

HEMT WITH PLATE OVER CHANNEL LAYER

BACKGROUND OF THE INVENTION

1. Field of the Invention

The present disclosure relates to a semiconductor device and a fabricating method thereof, and more particularly, to a semiconductor device having a high electron mobility transistor (HEMT) and a fabricating method thereof.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different band-gaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the two-dimensional electron gas. However, with the upgrading of electronic products, the structure and fabrication of the general high electron mobility transistors need to be further improved to meet the industrial requirements to gain diverse functionality.

SUMMARY OF THE INVENTION

One of the objectives of the present disclosure provides a semiconductor device and a fabricating method thereof, in which the semiconductor device further includes a field plate structure disposed between a gate electrode and a drain electrode, with the field plate structure including an extending portion extended toward a substrate, and with the extending portion of the field plate structure to reduce the surface electric field at one side of the gate electrode, so as to harmonize the voltage and electric field strength between the gate electrode and the drain electrode. Accordingly, the semiconductor device of the present disclosure may effectively increase the breakdown voltage while maintaining a certain on-resistance (Ron), thereby achieving an improved device performance.

To achieve the purpose described above, one embodiment of the present disclosure provides a semiconductor device including a substrate, a channel layer, a gate electrode, a first electrode, a second electrode and a metal plate. The channel layer is disposed on the substrate, and the gate electrode is disposed on the channel layer. The first electrode and a second electrode are disposed on the channel layer and respectively at two opposite sides of the gate electrode. The metal plate is disposed on the channel layer, between the first electrode and the gate electrode. The metal plate includes a first extending portion and a second extending portion, the second extending portion extends toward the substrate and not directly contacts the channel layer, and the first extending portion extends towards the first electrode or the second electrode and directly contacts the first electrode or the second electrode.

To achieve the purpose described above, one embodiment of the present disclosure provides a fabricating method of a semiconductor device including the following steps. Firstly, a substrate is provided, and a channel layer is formed on the substrate. Next, agate electrode is formed on the channel layer, and a first electrode and the second electrode are formed on the channel layer, respectively at two opposite sides of the gate electrode. Then, a metal plate is formed on the channel layer, between the first electrode and the gate electrode. The metal plate includes a first extending portion and a second extending portion, the second extending portion extends toward the substrate and not directly contacts the channel layer, and the first extending portion extends towards the first electrode or the second electrode and directly contacts the first electrode or the second electrode.

These and other objectives of the present disclosure will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a semiconductor device according to a first embodiment in the present disclosure, wherein:

FIGS. 4-6 are schematic diagrams illustrating a semiconductor device according to another embodiment in the present disclosure, wherein:

FIGS. 7-8 are schematic diagrams illustrating a semiconductor device according to a second embodiment in the present disclosure, wherein:

FIGS. 10-11 are schematic diagrams illustrating a semiconductor device according to a third embodiment in the present disclosure, wherein:

FIGS. 13-14 are schematic diagrams illustrating a semiconductor device according to a fourth embodiment in the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
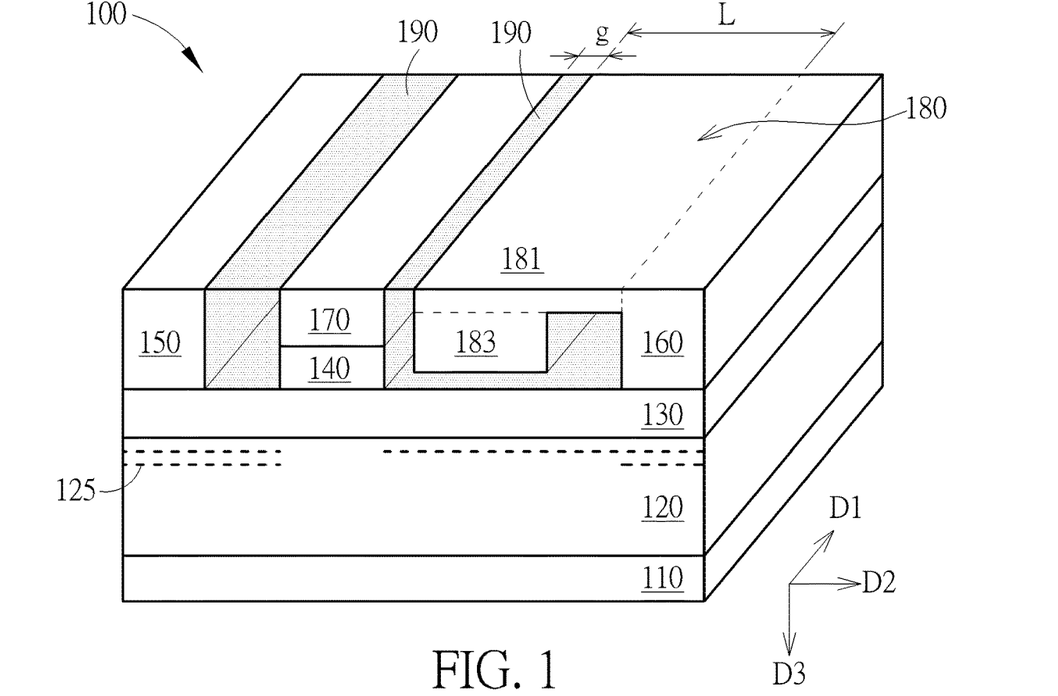
FIG. 1 shows a three-dimensional view of a semiconductor device.
Figure 2:
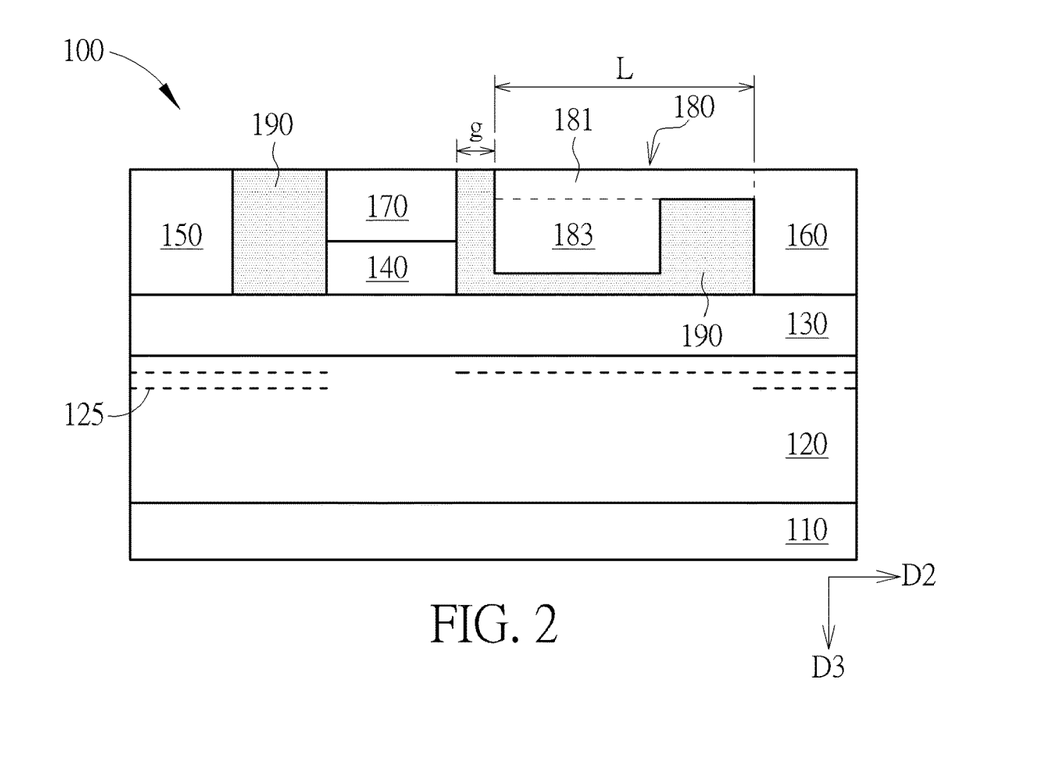
FIG. 2 shows a cross-sectional view of the semiconductor device.

Please refer to FIGS. 1-2, which illustrate schematic diagrams of a semiconductor device 100 according to the first embodiment in the present disclosure, with FIG. 1 and FIG. 2 respectively illustrating a three-dimensional view and a cross-sectional view of the semiconductor device 100. The semiconductor device 100 includes a substrate 110 and the substrate 110 may be formed by silicon or other semiconductor material. In one embodiment, the substrate 110 may include a silicon layer with <111> lattice structure, but not limited thereto. In another embodiment, the substrate 110 may also include a semiconductor compound such as silicon carbide (SiC), gallium arsenide (GaAs), indium arsenide (InAs) or indium phosphide (InP), or a semiconductor alloy such as silicon germanium (SiGe), silicon germanium carbide (SiGeC), gallium arsenide phosphide (AsGaP) or indium gallium phosphide (InGaP).

Then, a channel layer 120 and a barrier layer 130 are sequentially formed on the substrate 110. The channel layer 120 and the barrier layer 130 may respectively include different III-V materials, so that, a heterojunction is formed between the channel layer 120 and the barrier layer 130, thereby leading to discontinuous band-gaps. In the present disclosure, a "III-V material" refers to a compound semiconductor that includes at least one group III element or at least one group V element, where the group III element may be boron (B), aluminum (Al), gallium (Ga) or indium (In), and the group V element may be nitrogen (N), phosphorous (P), arsenic (As), or antimony (Sb). In the present embodiment, the channel layer 120 and the barrier layer 130 may together function like an active layer, wherein the barrier layer 130 may include aluminum gallium nitride ($Al_{x1}Ga_{1-x1}N$, with $x1$ being a constant greater than 0 and less than 1, $0<_{x1}<1$), the channel layer 120 may include gallium nitride (GaN), and the band-gap of the barrier layer 130 is greater than the band-gap of the channel layer 120. Accordingly, the electron of the barrier layer 130 generated by the piezoelectricity may fall in the channel layer 120, thereby forming a high mobility electron film namely a two-dimensional electron gas (2DEG) 125 within the channel layer 120 and adjacent to the barrier layer 130, as shown in FIG. 1.

Next, a P-type III-V composition layer 140, a source electrode 150, a drain electrode 160, and a gate electrode 170 are formed on the barrier layer 130. The gate electrode 170 is disposed on the P-type III-V composition layer 140, and the source electrode 150 and the drain electrode 160 are directly disposed on the barrier layer 130, at two sides of the P-type III-V composition layer 140 and the gate electrode 170, respectively. Precisely, the P-type III-V composition layer 140 is only disposed right below the gate electrode 170, so that, sidewalls of the P-type III-V composition layer 140 are vertically aligned with two sides of the gate electrode 170, as shown in FIGS. 1-2. In the present embodiment, the P-type III-V composition layer 140 includes but is not limited to P-type doped gallium nitride (pGaN), and which may further include a divalent dopant, such as magnesium (Mg), zinc (Zn), calcium (Ca), beryllium (Be), carbon (C) or iron (Fe). The gate electrode 170, the source electrode 150 and the drain electrode may include titanium (Ti), aluminum, titanium nitride (TiN), or other suitable conductive materials. Through these arrangements, the semiconductor device 100 may include a high electron mobility transistor (HEMT), with the divalent dopant occupying the original space of the III-V compound within a portion of the active layer which is right below the gate electrode 170, thereby depleting the two-dimensional electron gas 125 to form a normally off channel.

Furthermore, in one embodiment, a nucleation layer (not shown in the drawings), a transition layer (not shown in the drawings), and a superlattice layer (not shown in the drawings) may be additionally disposed between the substrate 110 and the channel layer 120 optionally. The nucleation layer, the transition layer and the superlattice layer respectively include a III-V material such as aluminum nitride or aluminum gallium nitride to be functioned like a buffer layer to compensating the lattice structure and/or the mismatch of the thermal expansion coefficient between the substrate 110 and the stacked layers (including the channel layer 120, the barrier layer 130 and the P-type III-V composition layer 140) disposed thereon, so as to provide a better basis for the epitaxial process. The nucleation layer, the transition layer and the superlattice layer may optionally include a P-type dopant to capture the electrons diffused from the substrate 110 to avoid affecting the two-dimensional electron gas 125.

It is noted that, the semiconductor device 100 further includes a metal plate 180 which is disposed between the gate electrode 170 and the drain electrode 160, and the metal plate 180 also includes a conductive material for example being the same as that of the gate electrode 170, the source electrode 150, and the drain electrode 160, like Ti, Pt, Au, Al, TiN, but not limited thereto. The metal plate 180 precisely includes a first extending portion 181 and a second extending portion 183, wherein the first extending portion 181 may have the same extending direction as the gate electrode 170, the source electrode 150, and the drain electrode 160, such as a direction D1 (y-direction for example), and a sidewall of the first extending portion 181 which is extended along the direction D1 may further extend toward another direction D2 (x-direction for example) which is perpendicular to the direction D1, to directly contact the drain electrode 160, as shown in FIG. 1 and FIG. 2. On the other hand, another sidewall of the first extending portion 181 which is also extended along the direction D1 may not directly contact the gate electrode 170, and which is separated from the gate electrode 170 by a certain distance "g". People in the art should fully realize that a length "L" of the first extending portion 181 in the direction D2 and the distance "g" between the first extending portion 181 and the gate electrode 170 may include different numerical ranges according to the practical size of each cell in the semiconductor device 100. For example, in one embodiment, the length "L" may be about 2-3 micrometers (μm), and the distance "g" may be about 1-2 μm, but is not limited thereto. The second extending portion 183 extends from the first extending portion 181, toward another direction D3 (z-direction for example) which is also perpendicular to the direction D1. In other word, the second extending portion 183 extends toward the substrate 110, and not directly contacts the barrier layer 130 disposed on the substrate 110.

Also, a passivation layer 190 is additionally disposed between the barrier layer 130 and the second extending portion 183, to electrically isolate the barrier layer 130 and the metal plate 180. Furthermore, the passivation layer 190 is filled in the gaps between the metal plate 180 and the aforementioned electrodes including the source electrode 150, the drain electrode 160 and the gate electrode 170, to electrically isolate each element, and the passivation layer 190 for example includes a dielectric material such as oxide material (for example including $SiO_x$ or $Al_2O_3$) or nitride material (for example including $SiN_x$ or AlN), but is not limited thereto.

With these arrangements, the metal plate 180 of the semiconductor device 100 may be configured as a field plate structure, through the horizontal extending portion thereof (namely, the first extending portion 181) extending toward the drain electrode 160 to electrically connect to the drain electrode 160, so that, the metal plate 180 and the drain electrode 160 may be equipotential. Also, through the vertical extending portion (namely, the second extending portion 183) of the metal plate 180 extends toward the substrate 110, the surface electric field of the gate electrode 170 near the drain electrode 160 may be reduced thereby. Precisely speaking, the disposition of the vertical extending portion may disperse the voltage and surface electric field between the gate terminal and the drain terminal of the high electron mobility transistor, and prevent the voltage and surface electric field from being concentrated at a position near the gate terminal. Accordingly, the distribution of voltage and surface electric field between the gate terminal and the drain terminal may be more uniform, so that the breakdown voltage of the semiconductor device 100 may be increased, for example, the breakdown voltage may be increased by about 1.5 to 2 times without increasing the on-resistance (Ron), thereby achieving better device performance.

In order to enable one of ordinary skill in the art to implement the present disclosure, a fabricating method of a semiconductor device 100 of the present disclosure is further described below. In one embodiment, the formations of each of the electrodes including the source electrode 150 and the drain electrode 160, and the metal plate 180 may be carried out simultaneously, and which may include but not limited to the following steps. Firstly, a substrate (for example the substrate 110 as shown in FIG. 1 and FIG. 2) is provided, and a channel layer (for example the channel layer 120 as shown in FIG. 1 and FIG. 2), a barrier layer (for example the barrier layer 130 as shown in FIG. 1 and FIG. 2) and a P-type III-V material layer (not shown in the drawings) are sequentially formed on the substrate. Next, the P-type III-V material layer is patterned to the P-type III-V composition layer 140 as shown in FIG. 1 and FIG. 2, through a mask layer (not shown in the drawings). Then, a passivation material layer (not shown in the drawings) is formed, and the passivation material layer is partially blocked by at least one photoresist layer (not shown in the drawings) to define the positions of each of the electrodes including the source electrode 150 and the drain electrode 160 as shown in FIG. 1 or FIG. 2 and a metal plate structure in the subsequent process. Following these, an etching process and a deposition process are sequentially performed to form a metal plate (for example the metal plate 180 as shown in FIG. 1 and FIG. 2) and each of the electrodes including the source electrode 150 and the drain electrode 160. Finally, another etching process and another deposition process may be performed sequentially, to form a gate electrode (for example the gate electrode 170 as shown in FIG. 1 and FIG. 2) on the P-type III-V composition layer 140, and also, to form a passivation layer (for example the passivation layer 190 as shown in FIG. 1 and FIG. 2). Accordingly, the metal plate 180, the source electrode 150 and the drain electrode 160 may be formed through the same fabricating process, to obtain the same conductive material, and also, the metal plate 180 and the drain electrode 160 may be monolithic, as shown in FIG. 1 and FIG. 2.

People well known in the arts should easily realize the semiconductor device and the forming method thereof in the present disclosure is not limited to the aforementioned embodiment, and may further include other examples or variety. The following description will detail the different embodiments of the semiconductor device and the forming method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Accordingly to other embodiments of the present disclosure, the breakdown voltage of the semiconductor device 100 may be further increased while maintaining the on-resistance of the semiconductor device 100, so as to obtain better device functions and qualities. Please refer to FIG. 3, in one embodiment, the vertical extending portion of a metal plate 280 may further include a plurality of sub-extending portions 283 and thus the metal plate 280 may entirely perform like a comb structure or a fence structure. Precisely speaking, each of the sub-extending portions 283 is spaced apart from each other in the direction D2, and a portion of the passivation layer 190 is filled between each of the sub-extending portions 283. Also, each of the sub-extending portions 283 extend from the first extending portion 181 along a direction toward the substrate 110 (namely, the direction D3) and not directly contact the barrier layer 130 underneath. People in the art should easily understand that a length "L1" of each sub-extending portion 283 in the direction D2 and a distance "g1" between each of the sub-extending portions 283 may include different numerical ranges according to the practical size of each cell in the semiconductor device 100. For example, in the present embodiment, the length "L1" may be about 0.5 μm and the distance "g1" may be about 1 μm, but is not limited thereto. With these arrangements, the vertical extending portion of the metal plate 280 may further efficiently disperse the voltage and surface electric field between the gate terminal and the drain terminal of the high electron mobility transistor, and the breakdown voltage of the semiconductor device 100 may be effectively increased thereby.

Figure 3:
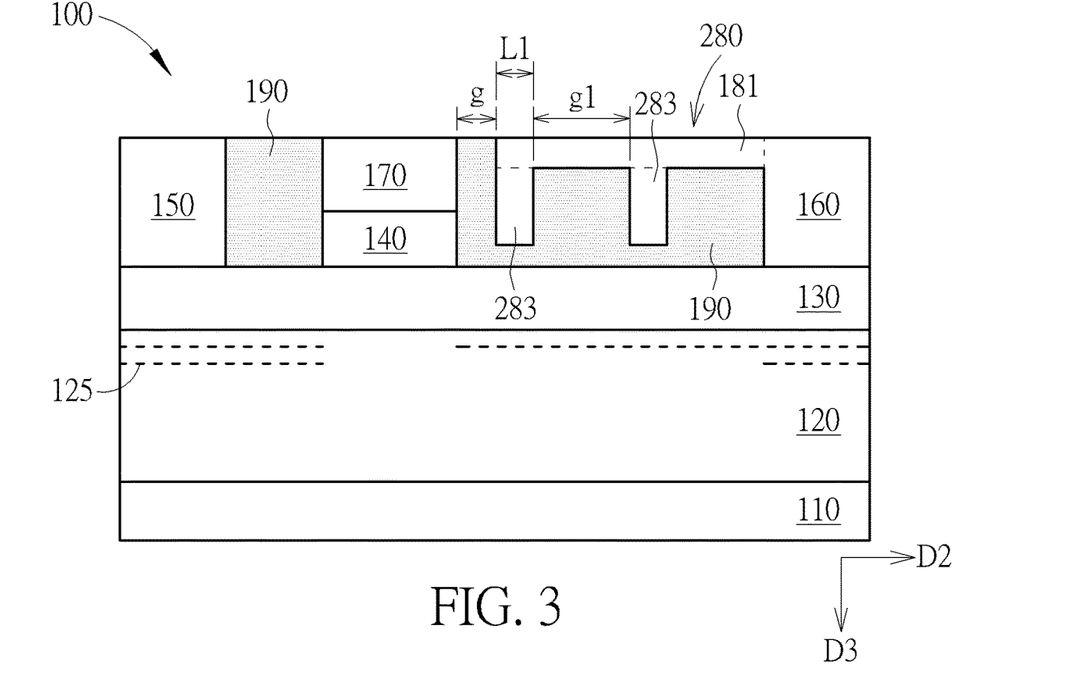
FIG. 3 is a schematic diagram illustrating a cross-sectional view of a semiconductor device according to another embodiment in the present disclosure.
Figure 4:
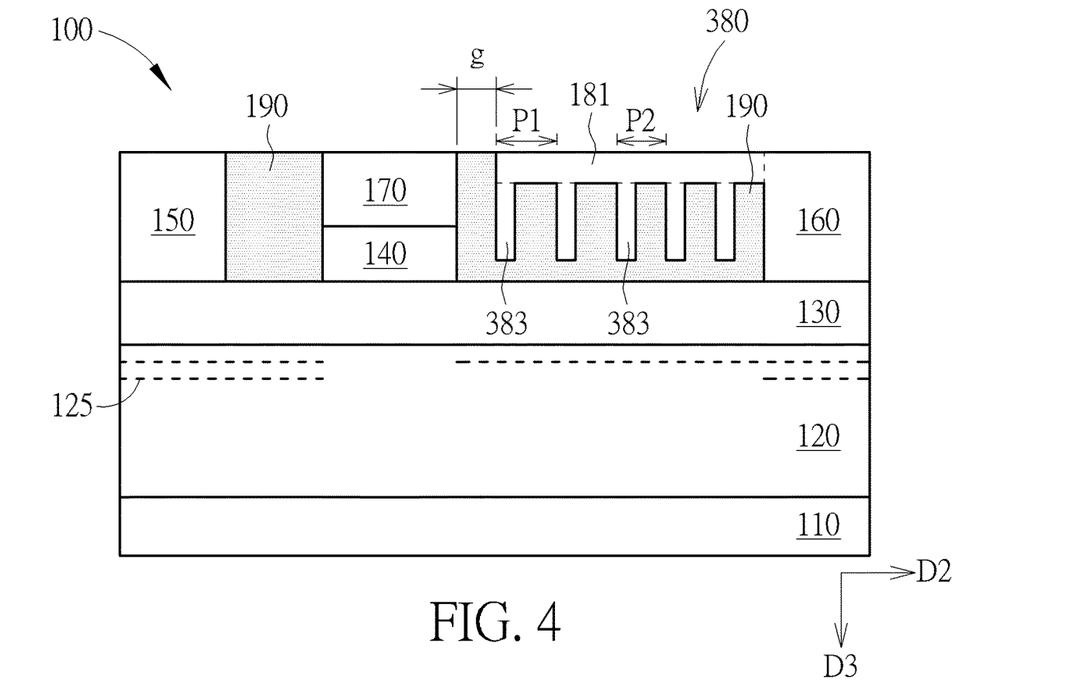
FIG. 4 shows a cross-sectional view of a semiconductor device.
Figure 5:
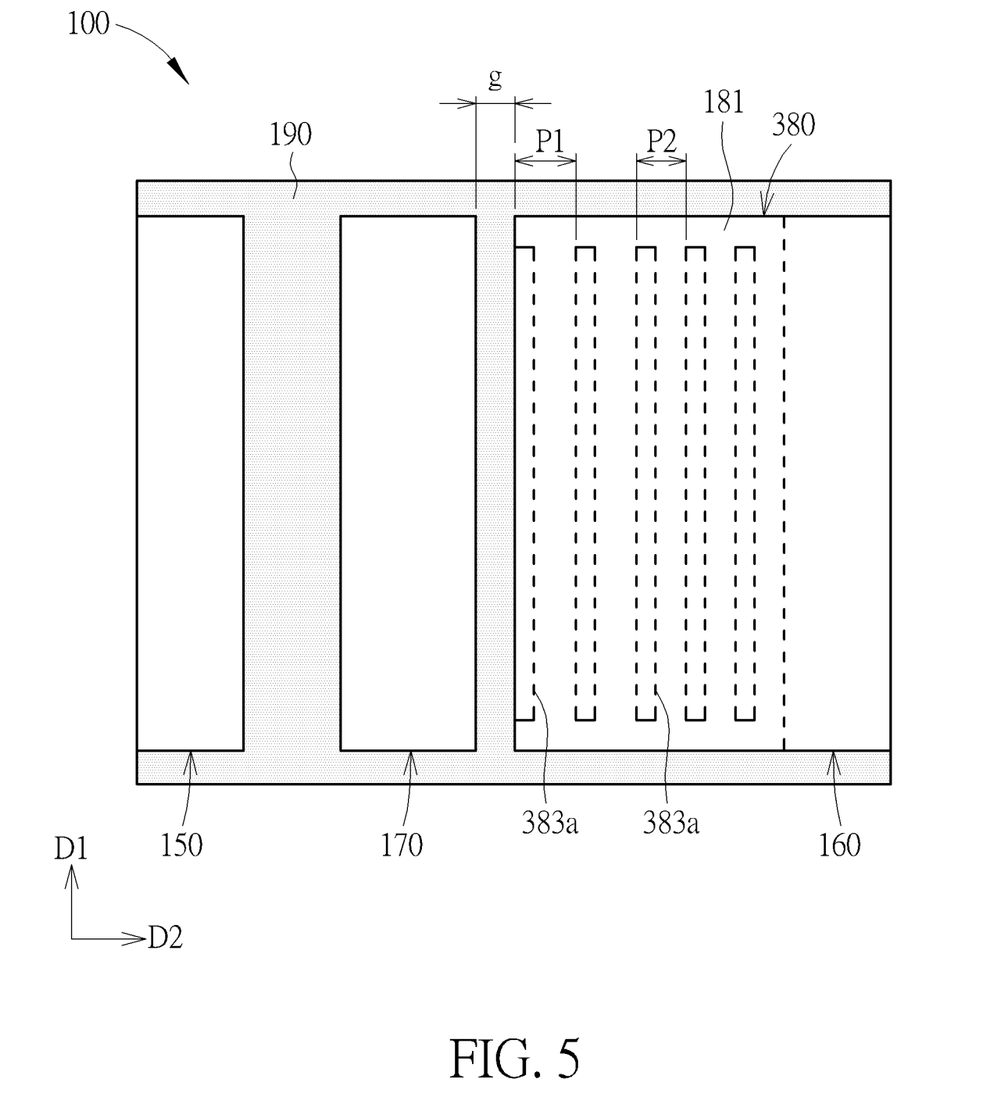
FIG. 5 shows a top view of the semiconductor device.
Figure 6:
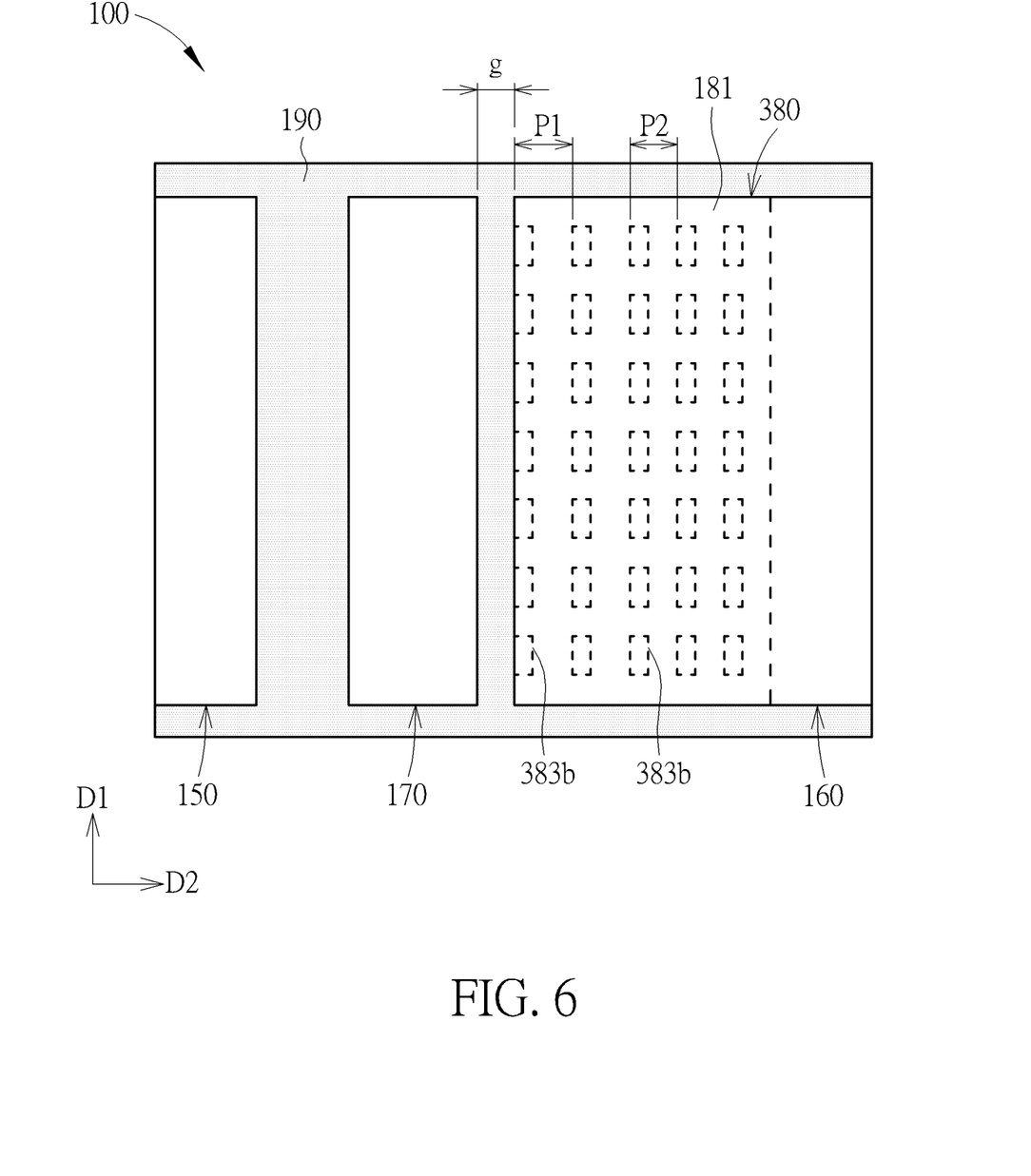
FIG. 6 shows another top view of the semiconductor device.

Moreover, the practical disposing number of the aforementioned sub-extending portions 283 may be two as shown in FIG. 3, or other number based on product requirements such as three or more than three. Also, the plurality of the sub-extending portions may optionally include different disposing pitch in the direction D2 or optionally include different disposing height in the direction D3. Please refer to FIGS. 4-6, in another embodiment, the vertical extending portion of a metal plate 380 also include a plurality of sub-extending portions 383, with each of the sub-extending portions 383 being spaced apart from each other and with a portion of the passivation layer 190 being filled between each of the sub-extending portions 383, and thus the metal plate 380 may entirely perform like a comb structure or a fence structure as shown in FIG. 4. It is noted that, the sub-extending portions 383 which are disposed near to the gate electrode 170 are space apart from each other by a pitch P1, and the sub-extending portions 383 which are disposed near to the drain electrode 160 are space apart from each other by a pitch P2. Preferably, the pitch P1 is greater than the pitch P2, so that, the disposing density of the sub-extending portions 383 near the drain terminal may be greater than the disposing density of the sub-extending portions 383 near the gate terminal, thereby further dispersing the voltage and the surface electric field near the gate terminal to the drain terminal, and further increasing the breakdown voltage of the semiconductor device 100. It is also noted that, FIG. 4 only illustrates a cross-sectional view of each sub-extending portions 383, and people the art should fully realize that if being views from a top view (not shown in the drawings) each of the sub-extending portions 383 may include a stripe shape structure 383a along the direction D1 as shown in FIG. 5, or include square shape structures 383b arranged along the direction D1 as shown in FIG. 6, but not limited thereto.

On the other hand, although the aforementioned sub-extending portions 383 including the sub-extending portions 283 and the sub-extending portions 383 include the same length in the direction D3, the practical disposing example is not limited thereto. In another embodiment, the plurality of the sub-extending portions may optionally include different lengths. For example, a portion of the sub-extending portions (not shown in the drawings) near the gate electrode 170 may have a relative shorter length in the direction D3, and another portion of the sub-extending portions (not shown in the drawings) near the drain electrode 160 may have a relative longer length in the direction D3, so that, the voltage and the surface electric field near the gate terminal may be further dispersed to the drain terminal, thereby increasing the breakdown voltage. Otherwise, under other product requirements, a portion of the sub-extending portions (not shown in the drawings) near the gate electrode 170 may also have a relative longer length in the direction D3, and another portion of the sub-extending portions (not shown in the drawings) near the drain electrode 160 may have a relative shorter length in the direction D3, optionally, or a portion of the sub-extending portions (not shown in the drawings) near the gate electrode 170 may have a relative greater disposing density, and another portion of the sub-extending portions (not shown in the drawings) near the drain electrode 160 may have a relative smaller disposing density, to achieve various product effects.

Figure 7:
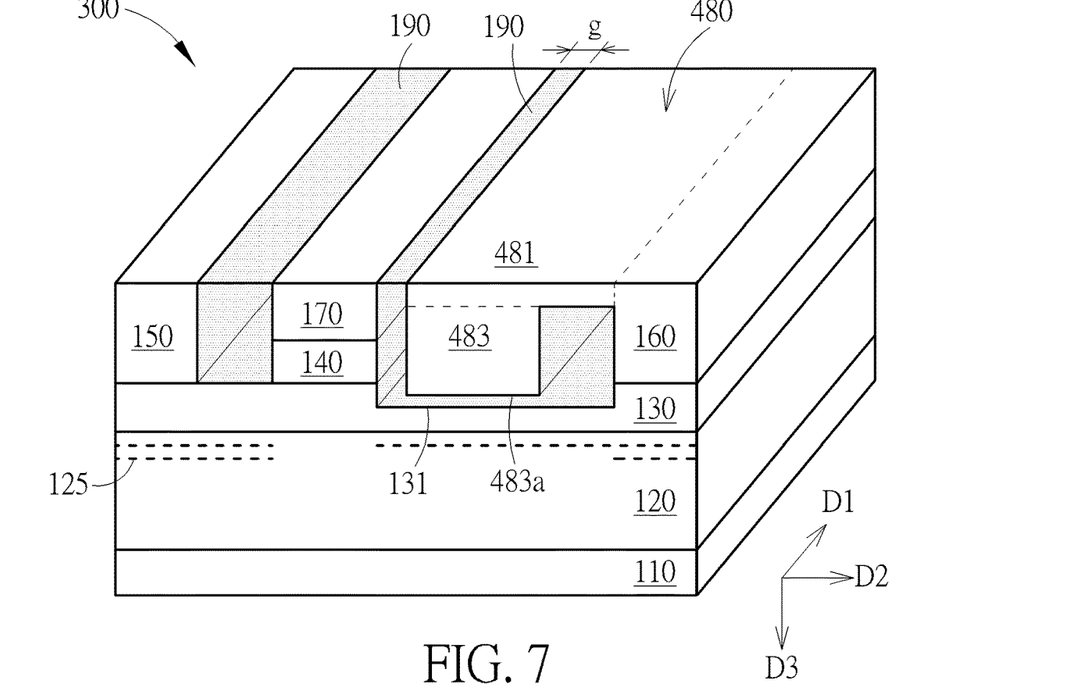
FIG. 7 shows a three-dimensional view of a semiconductor device.
Figure 8:
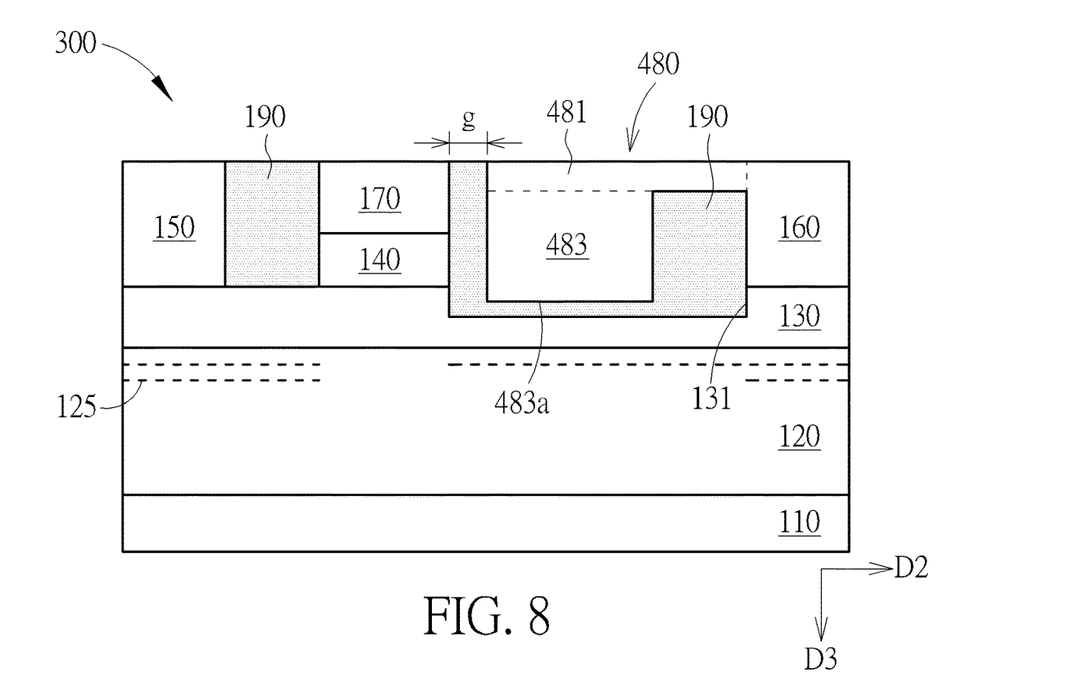
FIG. 8 shows a cross-sectional view of the semiconductor device.

Please refer to FIGS. 7-8, which illustrate schematic diagrams of a semiconductor device 300 according to the second embodiment in the present disclosure, with FIG. 7 and FIG. 8 respectively illustrating a three-dimensional view and a cross-sectional view of the semiconductor device 300. The structure of the semiconductor device 300 may be substantially the same as those of the aforementioned embodiment shown in FIGS. 1-2, and which also includes the substrate 110, the channel layer 120, the barrier layer 130, the P-type III-V composition layer 140, the source electrode 150, the drain electrode 160, the gate electrode 170, and the passivation layer 190 and all similarities will not be redundantly described thereinafter. The differences between the present embodiment and the aforementioned embodiment is mainly in that a trench 131 is additionally disposed in the barrier layer 130, between the gate electrode 170 and the drain electrode 160, and in alignment with the disposing position of a metal plate 480. More particularly, the trench 131 is disposed corresponding to the disposing position of the vertical extending portion of the metal plate 480.

Precisely speaking, the metal plate 480 is also disposed between the gate electrode 170 and the drain electrode 160, and which includes a first extending portion 481 and a second extending portion 483. The detailed features of the first extending portion 481 are substantially the same as those of the first extending portion 181 of the aforementioned embodiment, and will not be redundantly described hereinafter. The second extending portion 483 extends from the first extending portion 481 along the direction toward the substrate 110 (namely, the direction D3), and further extends into the trench 131. In the present embodiment, the trench 131 for example extends from one side of the gate electrode 170 to one side of the drain electrode 160 in the direction D2. In other words, the trench 131 does not penetrate through two opposite surfaces of the barrier layer 130, so that, the occupied area (namely an area) of the trench 131 in a projection direction which is perpendicular to the substrate 110 may be greater than the occupied area of the metal plate 480 in the projection direction. Meanwhile, the range (namely a width) of the trench 131 in the direction D2 may be greater than the range of the metal plate 480 in the direction D2, as shown in FIG. 8, but not limited thereto. In another embodiment, the occupied area of the trench may also be optionally the same as or smaller than that of the metal plate 480 in the projection direction or the direction D2 while the trench does not penetrate through the two opposite surfaces of the barrier layer.

With these arrangements, the second extending portion 483 (namely the vertical extending portion) of the metal plate 480 may further extend into the trench 131, with a bottommost surface 483a of the second extending portion 483 being lower than a topmost surface of the barrier layer 130 for example, and not directly in contact with the barrier layer 130 which is exposed from the bottom of the trench 131. Accordingly, a portion of the passivation layer 190 may be sandwiched between the second extending portion 483 and the barrier layer 130 which is exposed from the bottom of the trench 131, as shown in FIG. 8. In this way, the metal plate 480 of the semiconductor device 300 may also be configured as a field plate structure, through the horizontal extending portion thereof (namely, the first extending portion 481) extending toward the drain electrode 160 to electrically connect to the drain electrode 160, so that, the metal plate 480 and the drain electrode 160 may be equipotential. Also, through the vertical extending portion (namely, the second extending portion 483) of the metal plate 480 extends toward the substrate 110, and further extends into the trench 131 to reduce the surface electric field of the gate electrode 170 near the drain electrode 160. Thus, the voltage and surface electric field near the gate terminal may be further dispersed to the drain terminal, so as to increase the breakdown voltage of the semiconductor device 300.

Figure 9:
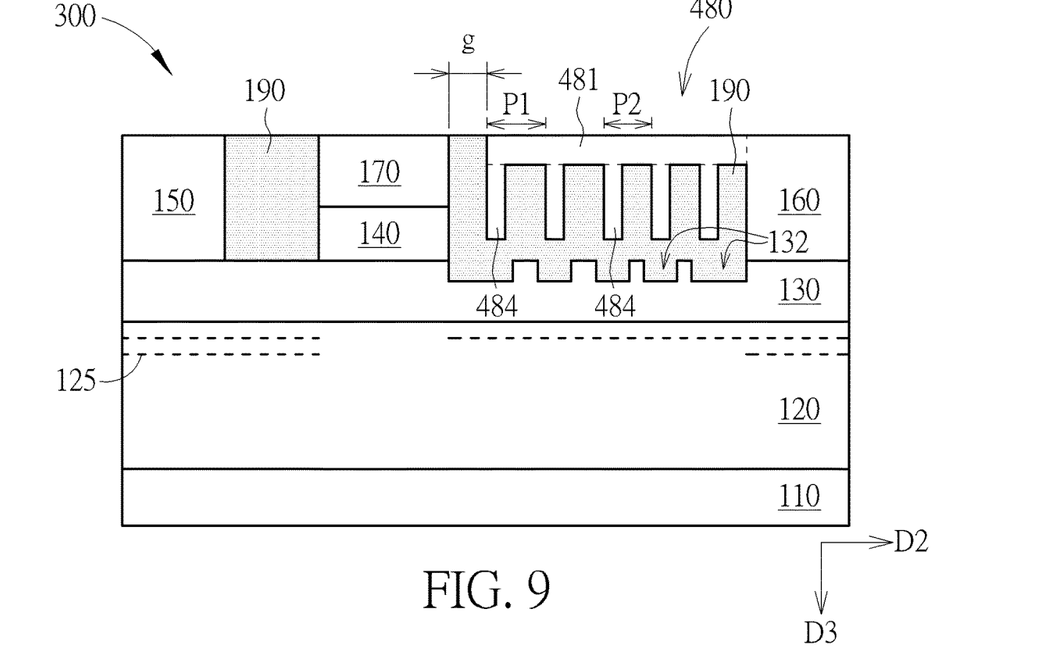
FIG. 9 is a schematic diagram illustrating a cross-sectional view of a semiconductor device according to another embodiment in the present disclosure.

On the other hand, although the vertical extending portion of the metal plate 480 in the present embodiment is only exemplified by having a single extending structure, people in the arts should fully understand that the vertical extending portion may further include a plurality of sub-extending portions such as the sub-extending portions 283 as shown in FIG. 3, or the sub-extending portions 383 as shown in FIG. 4. Also, if the sub-extending portions being viewed from a top view (not shown in the drawings), each of the sub-extending portions may also include a stripe shape structure 383a as shown in FIG. 5 or include square shape structures 383b as shown in FIG. 6, but not limited thereto. In addition, in the example of the vertical extending portion including a plurality of the sub-extending portions, a single trench such as the trench 131 as shown in FIGS. 7-8 may be optionally disposed in the barrier layer 130, corresponding to all of the sub-extending portions. Otherwise, as shown in FIG. 9, a plurality of trenches 132 may also be formed in the barrier layer 130, wherein the practical disposing number, disposing positions and the disposing pitch of the trenches 132 are corresponding to the practical disposing number, disposing positions and the disposing pitches P1, P2 of sub-extending portions 484 of the metal plate 480, and each of the trenches 132 may be respectively in alignment with each of the sub-extending portions 484. Accordingly, the breakdown voltage of the semiconductor device 300 may be further increased while maintaining the on-resistance of the semiconductor device 300, to obtain better device performances.

Figure 10:
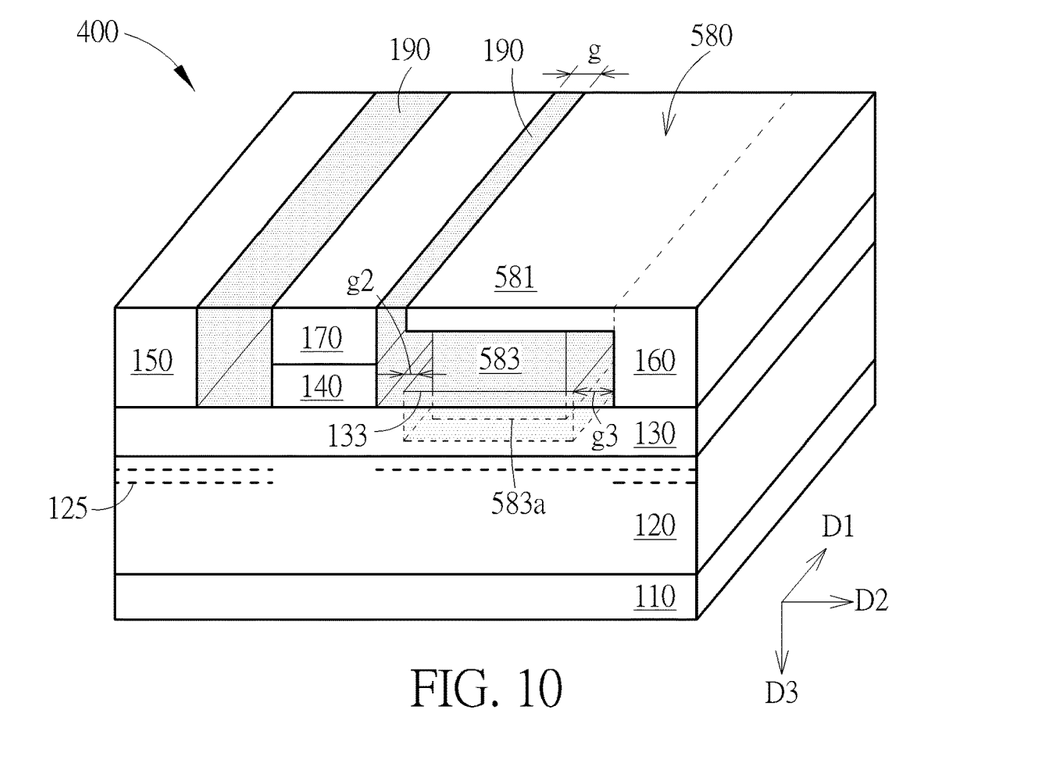
FIG. 10 shows a three-dimensional view of a semiconductor device.
Figure 11:
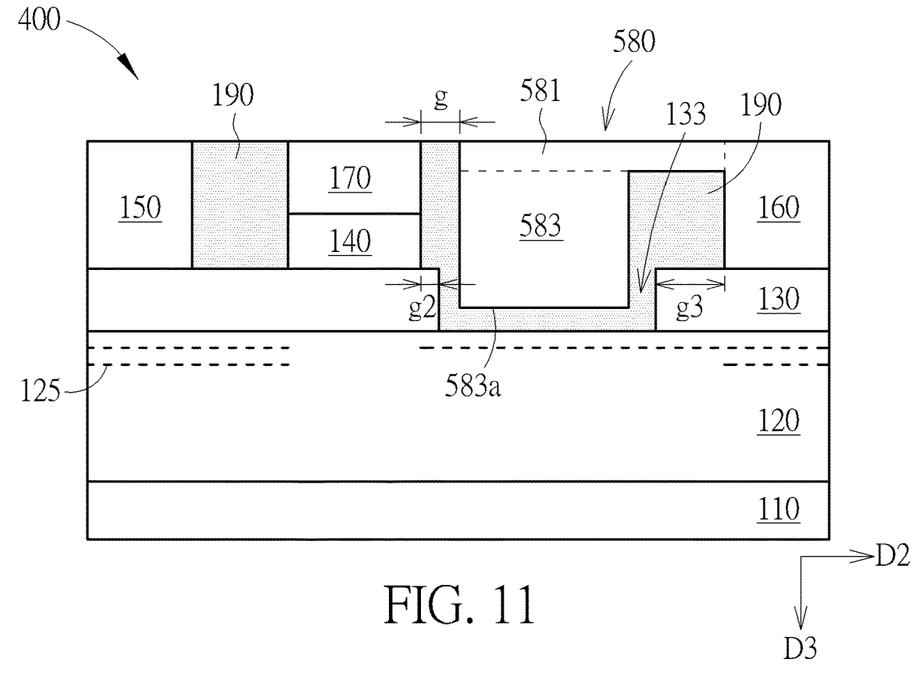
FIG. 11 shows a cross-sectional view of the semiconductor device.

Please refer to FIGS. 10-11, which illustrate schematic diagrams of a semiconductor device 400 according to the third embodiment in the present disclosure, with FIG. 10 and FIG. 11 respectively illustrating a three-dimensional view and a cross-sectional view of the semiconductor device 400. The structure of the semiconductor device 400 may be substantially the same as those of the aforementioned embodiment shown in FIGS. 1-2, and which also includes the substrate 110, the channel layer 120, the barrier layer 130, the P-type III-V composition layer 140, the source electrode 150, the drain electrode 160, the gate electrode 170, and the passivation layer 190 and all similarities will not be redundantly described thereinafter. The differences between the present embodiment and the aforementioned embodiment is mainly in that a trench 133 is additionally disposed between the gate electrode 170 and the drain electrode 160, and the trench 133 penetrates through two opposite surfaces of the barrier layer 130.

Precisely speaking, the metal plate 580 is also disposed between the gate electrode 170 and the drain electrode 160, and which includes a first extending portion 581 and a second extending portion 583. The detailed features of the first extending portion 581 are substantially the same as those of the first extending portion 181 of the aforementioned embodiment, and will not be redundantly described hereinafter. The second extending portion 583 extends from the first extending portion 581 along the direction toward the substrate 110 (namely, the direction D3), with the second extending portion being in alignment with the trench 133 underneath. In the present embodiment, two sides of the trench 133 do not directly in contact with the drain electrode 170 or the drain electrode 160, and accordingly, the two sides of the trench 133 may respectively space apart from the gate electrode 170 and the drain electrode 160 by a distance such as a distance "g2" and a distance "g3" as shown in FIG. 10 and FIG. 11. The distance "g2" between the trench 133 and the gate electrode 170 may not be equal to the distance "g3" between the trench 133 and the drain electrode 160, but is not limited thereto. In another embodiment, the trench 133 may also be respectively space apart from the gate electrode 170 and the drain electrode 160 by the same distance (not shown in the drawings) optionally.

With these arrangements, the second extending portion 583 (namely the vertical extending portion) of the metal plate 580 may further extend into the trench 133, with a bottommost surface 583a of the second extending portion 583 being lower than a topmost surface of the barrier layer 130 for example, and not directly in contact with the channel layer 120 which is exposed from the bottom of the trench 133. Accordingly, a portion of the passivation layer 190 may be sandwiched between the bottommost surface 583a of the second extending portion 583 and the channel layer 120 which is exposed from the bottom of the trench 133, as shown in FIG. 11. In this way, the metal plate 580 of the semiconductor device 400 may also be configured as a field plate structure, through the horizontal extending portion thereof (namely, the first extending portion 581) extending toward the drain electrode 160 to electrically connect to the drain electrode 160, so that, the metal plate 580 and the drain electrode 160 may be equipotential. Also, through the vertical extending portion (namely, the second extending portion 583) of the metal plate 580 extends toward the substrate 110, and further extends into the trench 133 to reduce the surface electric field of the gate electrode 170 near the drain electrode 160. Thus, the voltage and surface electric field near the gate terminal may be further dispersed to the drain terminal, so as to increase the breakdown voltage of the semiconductor device 400.

Figure 12:
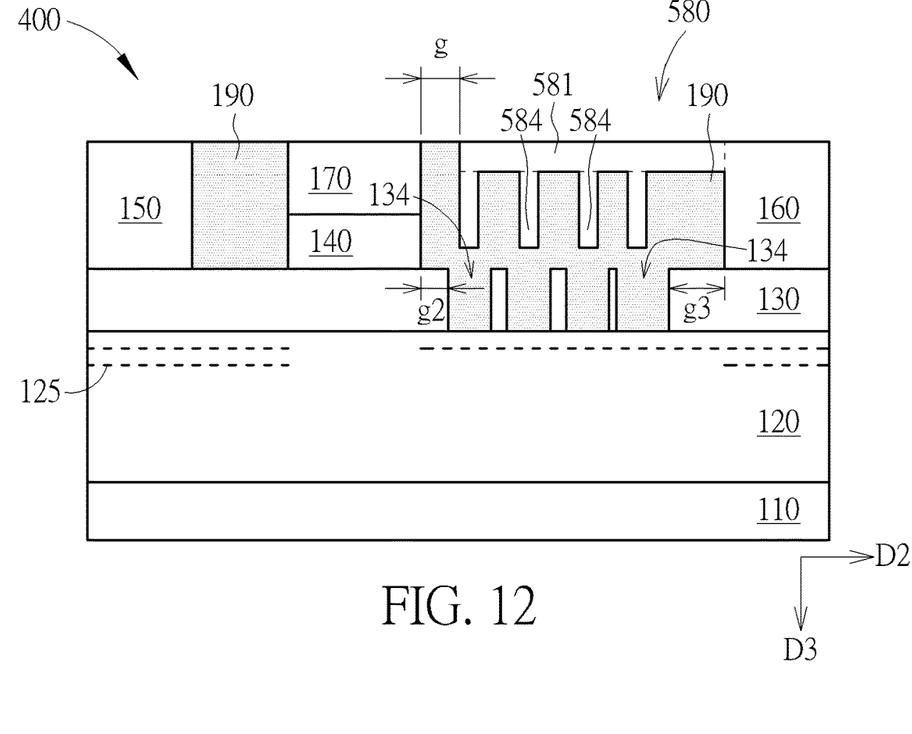
FIG. 12 is a schematic diagram illustrating a cross-sectional view of a semiconductor device according to another embodiment in the present disclosure.

On the other hand, although the vertical extending portion of the metal plate 580 in the present embodiment is only exemplified by having a single extending structure, people in the arts should fully understand that the vertical extending portion may further include a plurality of sub-extending portions such as the sub-extending portions 283 as shown in FIG. 3, or the sub-extending portions 383 as shown in FIG. 4. Also, if the sub-extending portions being viewed from a top view (not shown in the drawings), each of the sub-extending portions may also include a stripe shape structure 383a as shown in FIG. 5 or include square shape structures 383b as shown in FIG. 6, but not limited thereto. In addition, in the example of the vertical extending portion including a plurality of the sub-extending portions, a single trench such as the trench 133 as shown in FIGS. 10-11 may be optionally disposed in the barrier layer 130, corresponding to all of the sub-extending portions. Otherwise, as shown in FIG. 12, a plurality of trenches 134 may also be formed in the barrier layer 130, wherein the practical disposing number, disposing positions and the disposing pitch of the trenches 134 are corresponding to the practical disposing number, disposing positions and the disposing pitch of sub-extending portions 584 of the metal plate 580, and each of the trenches 134 may be respectively in alignment with each of the sub-extending portions 584. Accordingly, the breakdown voltage of the semiconductor device 400 may be further increased while maintaining the on-resistance of the semiconductor device 400, to obtain better device performances.

Figure 13:
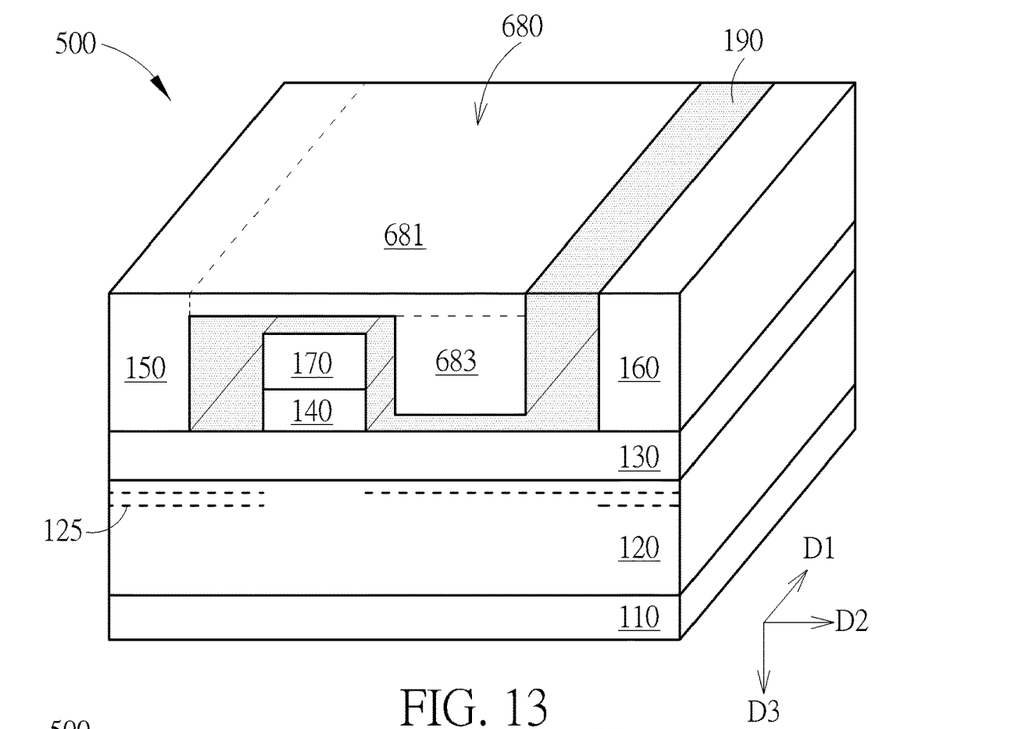
FIG. 13 shows a three-dimensional view of a semiconductor device.
Figure 14:
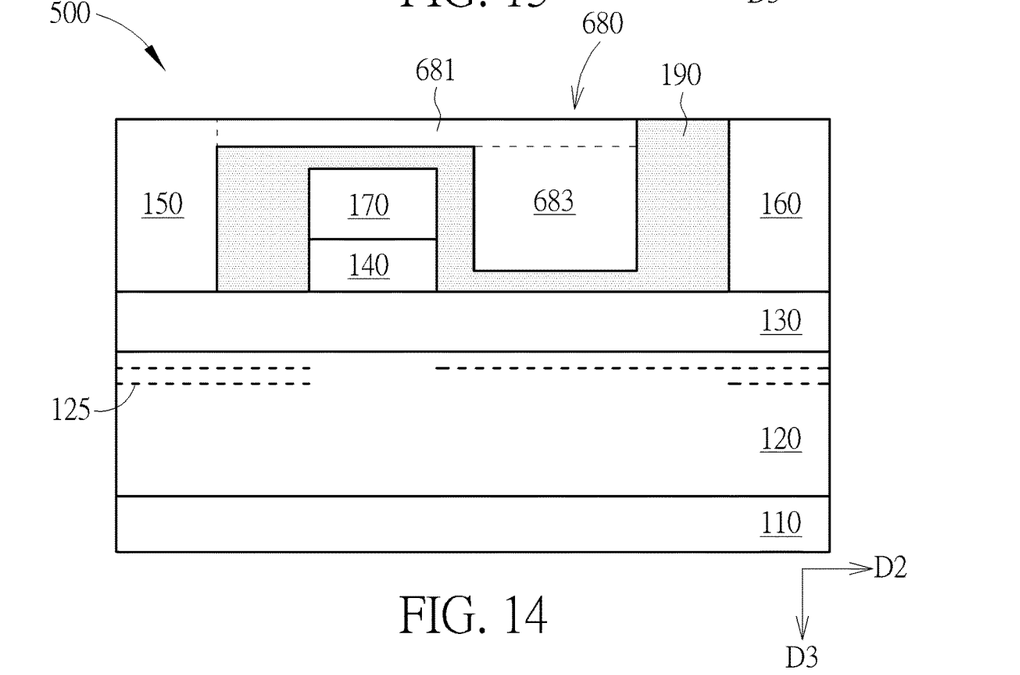
FIG. 14 shows a cross-sectional view of the semiconductor device.

Please refer to FIGS. 13-14, which illustrate schematic diagrams of a semiconductor device 500 according to the third embodiment in the present disclosure, with FIG. 13 and FIG. 14 respectively illustrating a three-dimensional view and a cross-sectional view of the semiconductor device 500. The structure of the semiconductor device 500 may be substantially the same as those of the aforementioned embodiment shown in FIGS. 1-2, and which also includes the substrate 110, the channel layer 120, the barrier layer 130, the P-type III-V composition layer 140, the source electrode 150, the drain electrode 160, the gate electrode 170, and the passivation layer 190 and all similarities will not be redundantly described thereinafter. The differences between the present embodiment and the aforementioned embodiment is mainly in that a metal plate 680 is electrically connected to the source electrode 150, so as to be equipotential.

In the present embodiment, the metal plate 680 is also disposed between the gate electrode 170 and the drain electrode 160, and which includes a first extending portion 681 and a second extending portion 683. The first extending portion 681 has the same extending direction with the gate electrode 170, the source electrode 150 and the drain electrode 160, such as the direction D1 (for example the y-direction), and a sidewall of the first extending portion 681 in the direction D1 may further extend toward the source electrode 150 to directly in contact with the source electrode 150. With these arrangements, a portion of the first extending portion 681 may be disposed over the gate electrode 170, without directly in contact with the gate electrode 170. Then, a portion of the passivation layer 190 may be sandwiched between the first extending portion 681 and the gate electrode 170, as shown in FIGS. 13-14. On the other hand, another sidewall of the first extending portion 681 in the direction D1 does not directly contact the drain electrode 160. The detailed features of the second extending portion 683 are substantially the same as those of the second extending portion 183 of the aforementioned embodiment, and will not be redundantly described hereinafter.

With these arrangements, the metal plate 680 of the semiconductor device 500 may also be configured as a field plate structure, through the horizontal extending portion thereof (namely, the first extending portion 681) extending toward the source electrode 150 to electrically connect to the source electrode 150, so that, the metal plate 680 and the source electrode 150 may be equipotential. Also, through the vertical extending portion (namely, the second extending portion 683) of the metal plate 680 extends toward the substrate 110 to reduce the surface electric field of the gate electrode 170 near the drain electrode 160. Thus, the disposing of the vertical extending portion may disperser the voltage and the surface electric field near the gate terminal to the drain terminal, so as to increase the breakdown voltage of the semiconductor device 500. In addition, although the vertical extending portion of the metal plate 680 in the present embodiment is only exemplified by having a single extending structure, people in the arts should fully understand that the vertical extending portion may further include a plurality of sub-extending portions such as the sub-extending portions 283 as shown in FIG. 3, or the sub-extending portions 383 as shown in FIG. 4. Also, if the sub-extending portions being viewed from a top view (not shown in the drawings), each of the sub-extending portions may also include a stripe shape structure 383a as shown in FIG. 5 or include square shape structures 383b as shown in FIG. 6, but not limited thereto. Accordingly, the breakdown voltage of the semiconductor device 500 may also be further increased while maintaining the on-resistance of the semiconductor device 500, to obtain better device performances.

Overall speaking, the semiconductor device of the present disclosure additionally disposes a field plate structure between the gate electrode and the drain electrode, wherein the field plate structure may be electrically connected to the drain electrode or the source electrode optionally, through a horizontal extending portion thereof, and the field plate structure may further extend toward the substrate without directly in contact with the barrier layer or the channel layer underneath, through a vertical extending portion thereof. Accordingly, the disposing of the vertical extending portion may effectively reduce the surface electric field at one side of the gate electrode 170, and the distribution of voltage and surface electric field between the gate terminal and the drain terminal may be more uniform thereby. In this way, the semiconductor device of the present disclosure may efficiently increase the breakdown voltage of the semiconductor device while maintaining a certain the on-resistance of the semiconductor device.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A semiconductor device, comprising:
   a substrate;
   a channel layer disposed on the substrate;
   a gate electrode disposed on the channel layer;
   a first electrode and a second electrode disposed on the channel layer and respectively at two opposite sides of the gate electrode; and
   a metal plate disposed on the channel layer, between the first electrode and the gate electrode, wherein the metal plate comprises a first extending portion and a second extending portion, the second extending portion extends in a vertical direction, and the second extending portion does not directly contact the channel layer, and the first extending portion extends from a sidewall of the first electrode toward the second electrode in a horizontal direction, and the first extending portion does not directly contact the second electrode, wherein the first extending portion does not overlap the first electrode or the second electrode, the first extending portion is spaced from the gate electrode by a distance, and the first extending portion comprises a top surface leveled with top surfaces of the first electrode and the second electrode.

2. The semiconductor device according to claim 1, wherein the second extending portion comprises a plurality of sub-extending portions sequentially arranged along a direction.

3. The semiconductor device according to claim 2, wherein each of the sub-extending portions comprises a stripe shape or a square shape.

4. The semiconductor device according to claim 2, wherein the sub-extending portions further comprises a plurality of first sub-extending portions and a plurality of second sub-extending portions and a pitch of the first sub-extending portions is different from a pitch of the second sub-extending portions.

5. The semiconductor device according to claim 4, wherein the second sub-extending portions are disposed adjacent to the first electrode, the first sub-extending portions are disposed adjacent to the gate electrode, and the pitch of the second sub-extending portions is smaller than the pitch of the first sub-extending portions.

6. The semiconductor device according to claim 1, further comprising:
   a barrier layer disposed between the gate electrode and the channel layer; and
   at least one trench disposed in the barrier layer, below the metal plate.

7. The semiconductor device according to claim 6, wherein a bottommost surface of the second extending portion is lower than a topmost surface of the barrier layer.

8. The semiconductor device according to claim 6, wherein the at least one trench does not penetrate through two opposite surfaces of the barrier layer, and a side of the at least one trench directly contacts a side of the gate electrode.

9. The semiconductor device according to claim 8, wherein another side of the at least one trench directly contacts the first electrode.

10. The semiconductor device according to claim 8, wherein the second extending portion further comprises a plurality of sub-extending portions sequentially arranged along a direction, and the at least one trench is corresponding to all of the sub-extending portions.

11. The semiconductor device according to claim 8, wherein the second extending portion further comprises a plurality of sub-extending portions sequentially arranged along a direction, and a plurality of the trenches is corresponding to the sub-extending portions respectively.

12. The semiconductor device according to claim 6, wherein the at least one trench penetrates through two opposite surfaces of the barrier layer, and a side of the at least one trench spaces apart from a side of the gate electrode by a distance.

13. The semiconductor device according to claim 6, wherein another side of the at least one trench space apart from a side of the first electrode by a distance.

14. The semiconductor device according to claim 12, wherein the second extending portion further comprises a plurality of sub-extending portions sequentially arranged along a direction, and the at least one trench is corresponding to all of the sub-extending portions.

15. The semiconductor device according to claim 12, wherein the second extending portion further comprises a plurality of sub-extending portions sequentially arranged along a direction, and a plurality of the trenches is corresponding to the sub-extending portions respectively.

16. The semiconductor device according to claim 1, wherein the first electrode comprises a drain electrode and the second electrode comprises a source electrode.

17. The semiconductor device according to claim 1, wherein a portion of the first extending portion is disposed over the gate electrode.

18. The semiconductor device according to claim 1, wherein the first electrode, the second electrode and the metal plate comprise a same conductive material.

19. A method of forming a semiconductor device, comprising:
    providing a substrate;
    forming a channel layer on the substrate;
    forming a gate electrode on the channel layer;
    forming a first electrode and a second electrode on the channel layer and respectively at two opposite sides of the gate electrode; and
    forming a metal plate on the channel layer, between the first electrode and the gate electrode, wherein the metal plate comprises a first extending portion and a second extending portion, the second extending portion extends in a vertical direction, and the second extending portion does not directly contact the channel layer, and the first extending portion extends from a sidewall of the first electrode toward the second electrode in a horizontal direction, and the first extending portion does not directly contact the second electrode, wherein the first extending portion does not overlap the first electrode or the second electrode, the first extending portion is spaced from the gate electrode by a distance, and the first extending portion comprises a top surface leveled with top surfaces of the first electrode and the second electrode.

20. The method of forming the semiconductor device according to claim 19, further comprising:
    forming a barrier layer between the gate electrode and the channel layer; and
    forming at least one trench in the barrier layer, the at least one trench is formed below the metal plate.

\* \* \* \* \*